(12) United States Patent
Pare et al.

(10) Patent No.: US 10,620,272 B2
(45) Date of Patent: Apr. 14, 2020

(54) BATTERY PACK FOR USE DOWNHOLE HAVING TORSION-LIMITING MEANS

(71) Applicant: CHARGER INDUSTRIES CANADA LIMITED PARTNERSHIP, Calgary (CA)

(72) Inventors: Quentin Pare, Calgary (CA); Carl Brown, Calgary (CA); Tyler Armstrong, Calgary (CA)

(73) Assignee: CHARGER INDUSTRIES CANADA LIMITED PARTNERSHIP, Calgary, AB (CA)

( * ) Notice: Subject to any disclaimer, the term of this patent is extended or adjusted under 35 U.S.C. 154(b) by 196 days.

(21) Appl. No.: 15/865,019

(22) Filed: Jan. 8, 2018

(65) Prior Publication Data
US 2019/0212393 A1    Jul. 11, 2019

(51) Int. Cl.
| | |
|---|---|
| *E21B 47/12* | (2012.01) |
| *G01R 31/378* | (2019.01) |
| *H01M 2/10* | (2006.01) |
| *H01M 2/02* | (2006.01) |
| *G01V 11/00* | (2006.01) |
| *H01M 10/0525* | (2010.01) |
| *G01R 31/382* | (2019.01) |

(52) U.S. Cl.
CPC ......... *G01R 31/378* (2019.01); *G01R 31/382* (2019.01); *G01V 11/002* (2013.01); *H01M 2/022* (2013.01); *H01M 2/1022* (2013.01); *H01M 10/0525* (2013.01); *E21B 47/12* (2013.01)

(58) Field of Classification Search
CPC ...... E21B 47/12; E21B 17/1042; H01M 2/10; H01M 2/02; H01M 2/022
See application file for complete search history.

(56) References Cited

U.S. PATENT DOCUMENTS

| | | | | |
|---|---|---|---|---|
| 3,995,479 A | * | 12/1976 | Chapman, III | ..... E21B 17/1042 73/152.47 |
| 4,547,833 A | | 10/1985 | Sharp | |
| 4,779,852 A | | 10/1988 | Wassell | |

(Continued)

FOREIGN PATENT DOCUMENTS

CA    2463354 A1    10/2005

OTHER PUBLICATIONS

ISA/CA-Canadian Intellectual Property Office—The International Search Report and the Written Opinion of the International Searching Authority dated Oct. 12, 2018.

*Primary Examiner* — Catherine Loikith
(74) *Attorney, Agent, or Firm* — D. Doak Horne

(57) ABSTRACT

An elongate battery pack for use in MWD drilling apparatus having torsion damping means at one or both ends thereof to reduce or eliminate "high g" rotational accelerations and decelerations being transmitted from the drill string to the battery pack within the MWD apparatus. In one embodiment the torsion damping means comprises torsion limiting means in the form of an electrical connector which allows electrical communication between the battery pack and remaining components of the MWD apparatus, but which allows relative rotational movement between (i) the MWD apparatus and its associated electrical leads connected to the battery pack, and (ii) the electrical leads in the battery pack connected to the battery therein.

11 Claims, 15 Drawing Sheets

(56) References Cited

U.S. PATENT DOCUMENTS

| | | | |
|---|---|---|---|
| 5,474,859 A | 12/1995 | Takeuchi et al. | |
| 6,187,469 B1 | 2/2001 | Marincic et al. | |
| 7,735,579 B2 * | 6/2010 | Gopalan | E21B 47/187 |
| | | | 175/40 |
| 8,157,002 B2 * | 4/2012 | Clarkson | E21B 17/028 |
| | | | 166/380 |
| 8,251,160 B2 * | 8/2012 | Gopalan | E21B 47/187 |
| | | | 175/40 |
| 8,474,548 B1 * | 7/2013 | Young | E21B 47/187 |
| | | | 175/40 |
| 9,638,025 B2 | 5/2017 | Pare et al. | |
| 10,344,590 B1 * | 7/2019 | Young | |
| 2006/0243489 A1 | 11/2006 | Wassell et al. | |
| 2016/0053557 A1 | 2/2016 | Whiteford et al. | |
| 2016/0164056 A1 | 6/2016 | Templeman et al. | |

\* cited by examiner

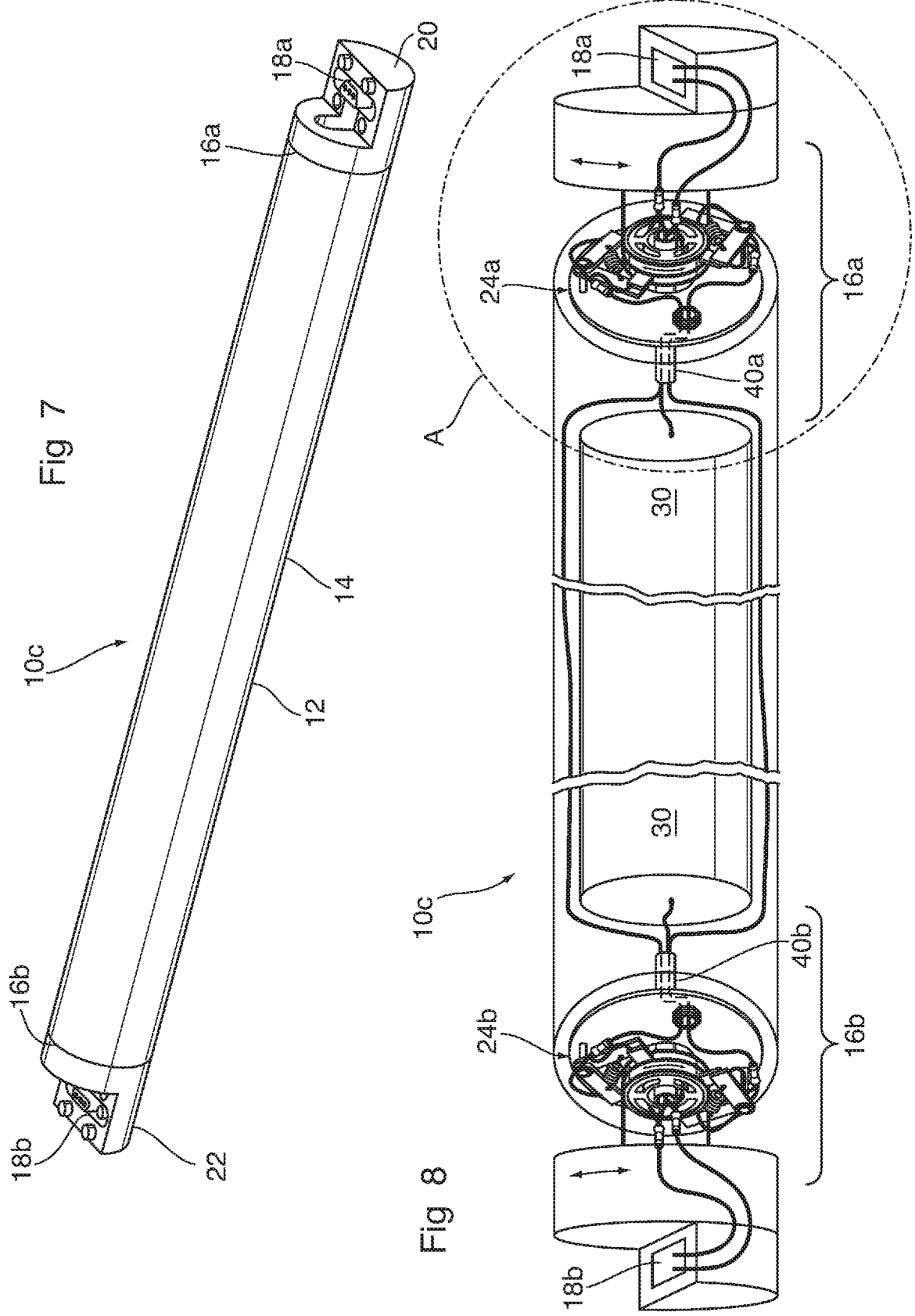

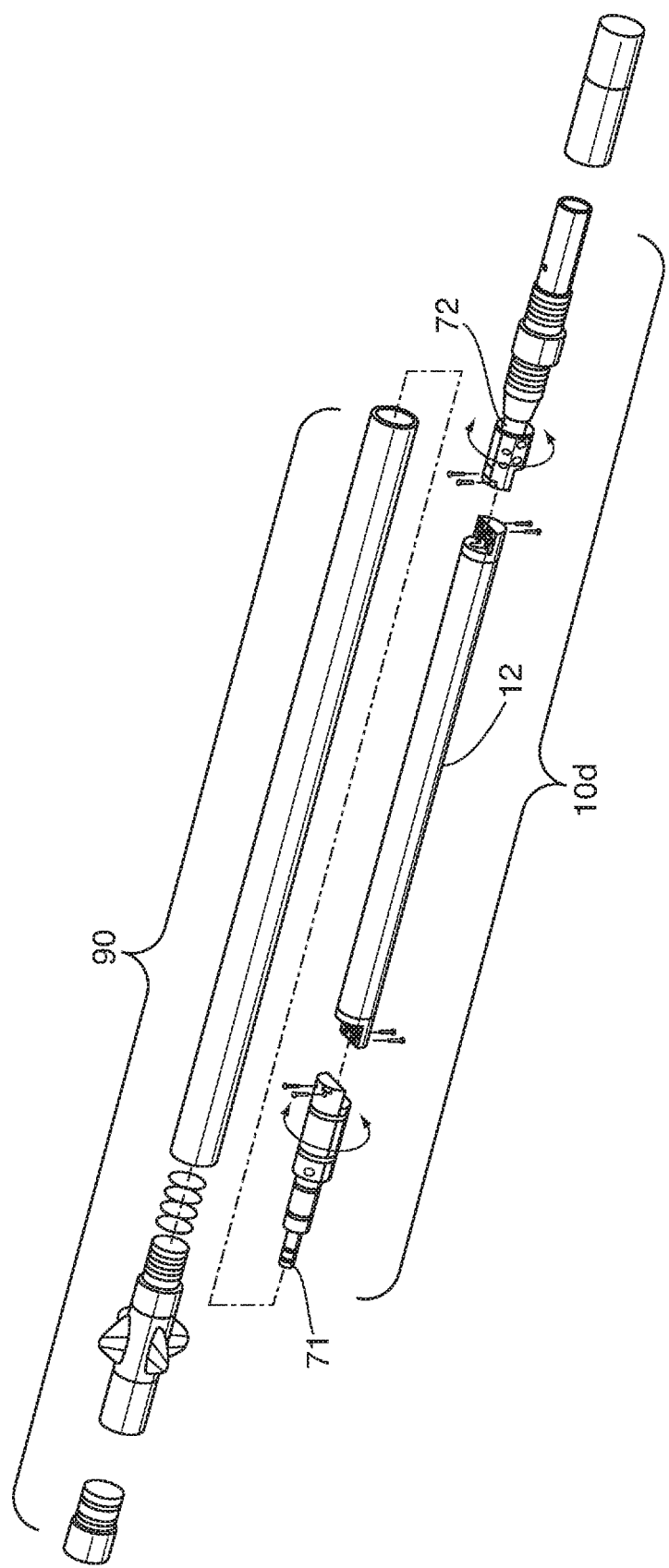

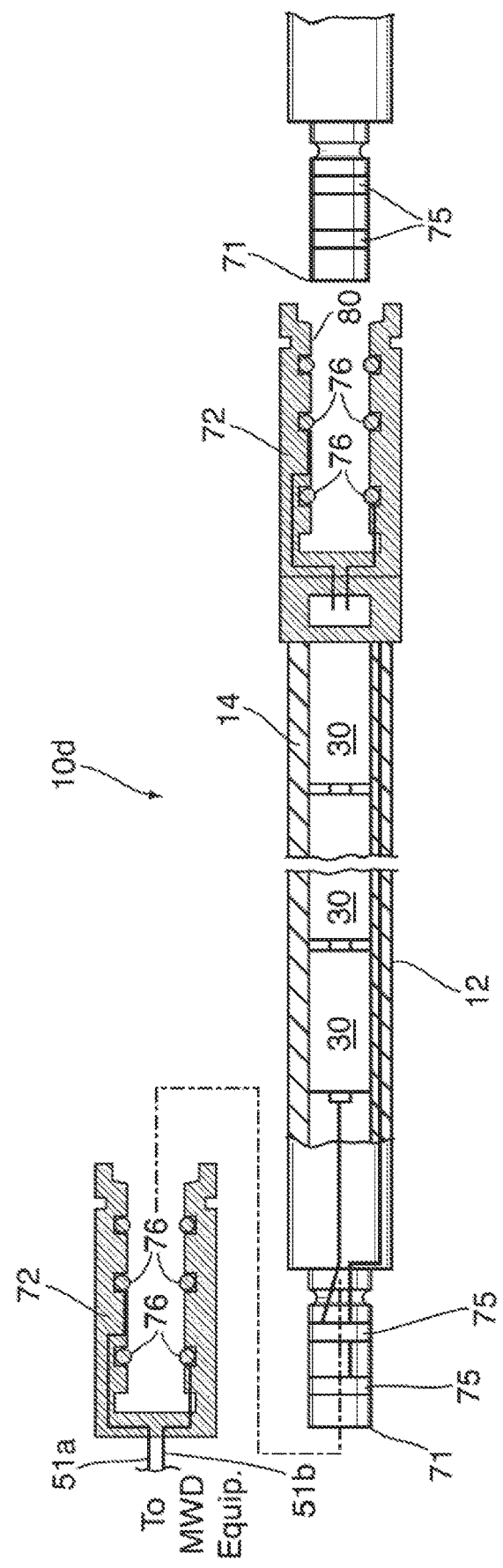

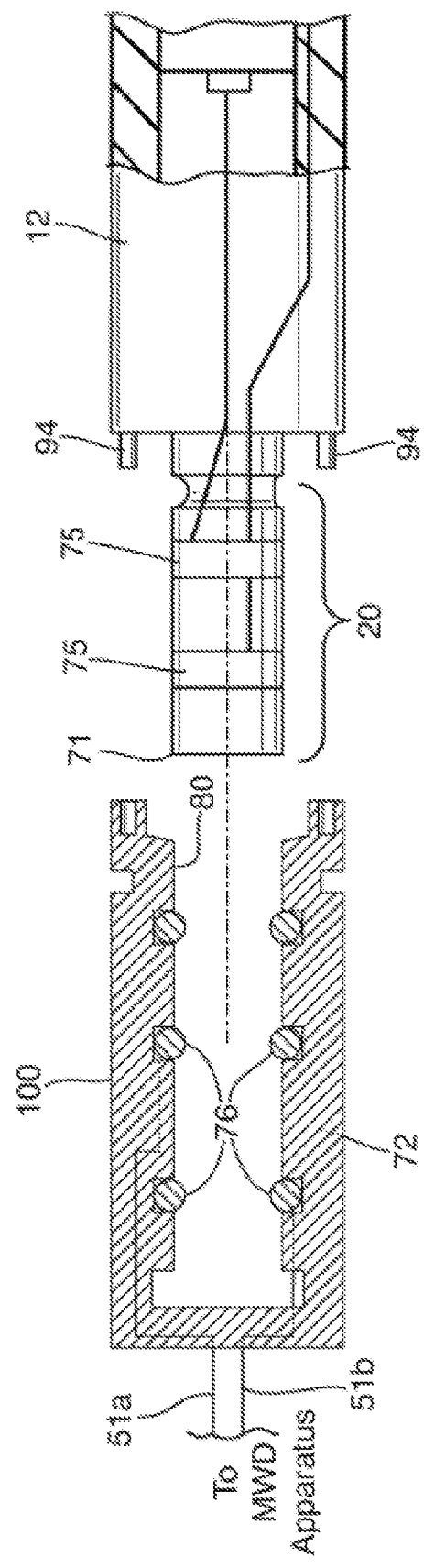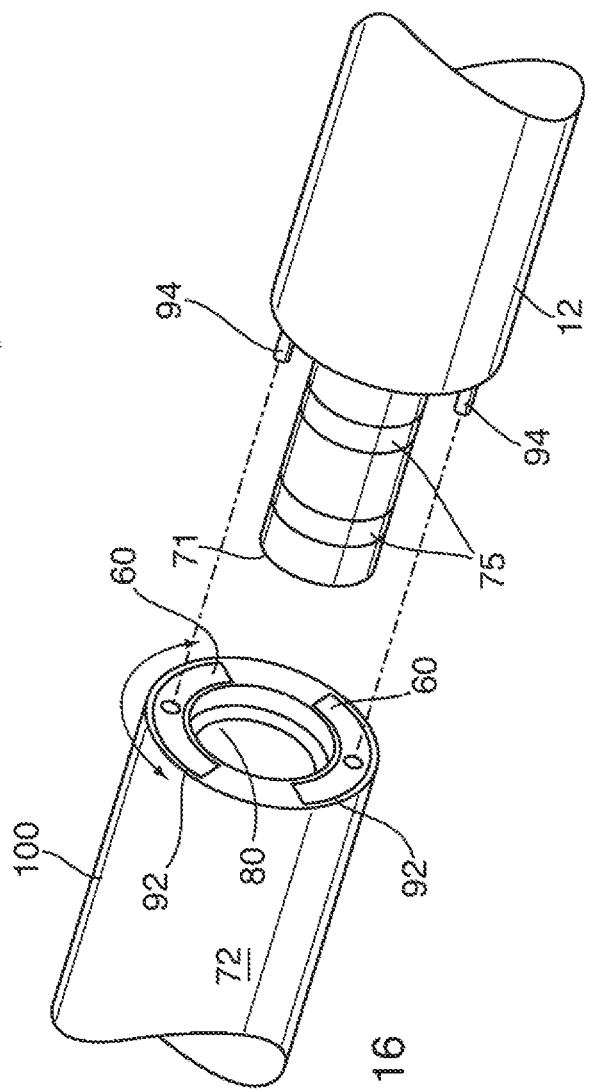

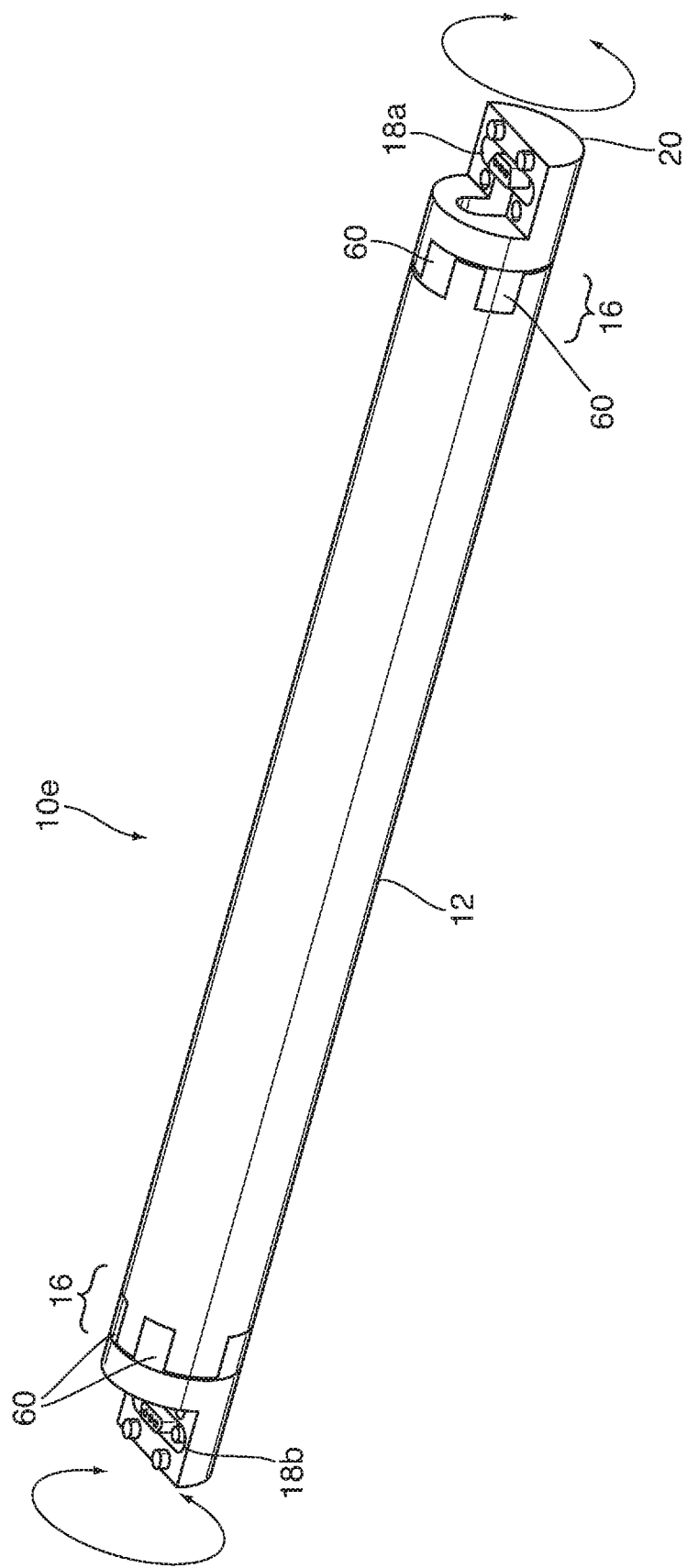

BATTERY PACK FOR USE DOWNHOLE HAVING TORSION-LIMITING MEANS

FIELD OF THE INVENTION

The present invention relates to downhole measurement-while-drilling ("MWD") apparatus, and more particularly to an elongate battery pack for use in MWD drilling apparatus having torsion damping or torsion-limiting means at one or both ends thereof to thereby eliminate or reduce "high g" rotational accelerations and decelerations being transmitted from the drill string to the battery pack within the MWD apparatus. In one embodiment the torsion damping means comprises an electrical slip ring which allows electrical communication between the battery pack and remaining components of the MWD apparatus, but allows relative rotational movement therebetween.

BACKGROUND OF THE INVENTION AND DESCRIPTION OF THE PRIOR ART

Drilling of wells, and in particular the directional drilling of wells requires continuous measuring of sensed information as to the location of the drill bit, such as inclination of the drill string and drill bit and the angular orientation (azimuth) thereof, so that this critical information may then be conveyed uphole in real time to the drill operator at surface to allow instantaneous adjustments to be made that will ensure the well is being drilled as desired.

For such so-called "measurement while drilling" drilling applications, particularly where the drill bit is rotary steerable, sophisticated battery-powered electronics located in "subs" threadably inserted in the drill string proximate the drill bit sense the desired directional parameters in relation to the drill bit.

Devices such as mud pulsers situated downhole in the drill string and operatively electrically coupled to the downhole electronics, encode the sensed data into a series of pressure pulses. These pressure pulses travel uphole where they are sensed by additional electronic equipment and decoded into the relevant data for the operator to view in real time.

U.S. Pat. No. 9,638,025 entitled "Mud pulser with Poppet Valve, having Linear determination means" and CA 2,463,354 entitled "Intelligent Efficient Servo-Actuator with Sensor for Downhole Pulser" respectively describe two such mud-pulser units for use in such mud-pulse telemetry which have an electric motor therein which regulates/moves a servo-valve to create the desired mud pulses by which the encoded data is sent uphole.

Due to downhole electronics and electrically-powered servo-motors of mud pulsers all requiring battery power, it is necessary that batteries situated downhole in a drill string continually supply high power and have long life to thereby avoid having to frequently "trip out" the drill string to replace batteries in the drill string. "Tripping out" of a drill string is not only expensive but also very time consuming, and it is thus desired that the battery life be as long as possible to reduce the frequency of having to 'trip out' the drill string.

Disadvantageously the aforementioned high pressure pulses continually generated downhole for the purposes of mud pulse telemetry create large vibrational forces which detrimentally affect downhole electronics and batteries.

Some prior art "packaging" systems for MWD electronics have been created to attempt to isolate downhole MWD electronics from vibration and shock forces during drilling which act on the housing within the drill string.

For example, U.S. Pat. No. 4,547,833 entitled "High Density Electronics Packaging System for Hostile Environment" is one such packaging system which utilizes annular shoe supports provided on the chassis to isolate such electronics from axial vibrations and axial forces.

However, during drilling operations, particularly at the greater and greater depths and lengths of deviated wells, drill-string "wind-up" can be extensive and effectively cause the drill string to act like a rotary spring. Once torque has been applied to the drill string to allow the drill to operate and drill, backing off the downhole pressure applied to the bit ("weight on bit") even momentarily can result in the drill string effectively becoming unsprung and large torsional acceleration forces being applied to MWD equipment, potentially exceeding 100 g, as the drill string unwinds.

US 2016/0053557 entitled "Torsional Isolator" is a device which attempts to reduce (axial) vibration and shock during directional drilling inflicted on electronics. Such device, however, is not directed at reducing torsional acceleration forces per se. Rather, the torsional isolator of US 2016/0053557 allows the drill string electronics to oscillate at a slower rotational velocity than the data acquisition rate of the associated sensors such that the sensor records only an average value of azimuth heading and thereby purportedly allows for a higher accuracy measurement of the azimuth heading by the downhole sensor.

The above background information and description of prior publications is provided for the purpose of making known information believed by the applicant to be of possible relevance to the present invention. No admission is necessarily intended nor should be construed that any of the above below publications and information provided below constitutes prior art against the present invention.

SUMMARY OF THE INVENTION

Due to need for long battery life and high electrical power output in MWD drilling applications, modern downhole batteries in MWD applications are often, although not always, of the lithium-ion configuration, and are often "daisy chained" together in series or in parallel to achieve the desired voltages and amp-hours to run the required electronic and downhole MWD electronica and mud pulse telemetry devices.

These types of batteries usually require the lithium component of such batteries to be molten or in liquid state when operating in order to provide the maximum power output. At the elevated temperatures typically encountered downhole this is usually achievable.

Disadvantageously, however, lithium ion batteries, in part due to the inherent high imparted vibratory stresses in downhole hostile environments, are frequently prone to failure, resulting in expensive and frequent "tripping out" of the drill string to replace structurally-compromised or failed batteries.

While axial vibrational forces imparted on such batteries, due to the rapid pressure pulsing by the mud pulser units, are no doubt a contributing cause of the battery failures, the inventors now believe that due to the high rotational acceleration forces as described above being inflicted on such batteries, which rotational acceleration forces sometimes exceed 100 g's, that such rotational forces alone or together with imparted axial vibrations and accelerations, cause the higher incidences of failures of such batteries.

Accordingly a real need exists for providing high energy battery packs downhole, such as those of the lithium ion type, for use in MWD drilling but which have means to prevent high torsional forces being transmitted to and imparted on such battery packs.

Vibrational isolators for batteries are known, such as the example disclosed in US 2016/0164056 entitled "Battery Holder and Isolator Assembly" for a vibrational isolator for a conventional automobile battery.

Automotive batteries, however, are not typically subjected to rotational forces, and moreover it is not in any way apparent how the battery isolator of US 2016/0164056 for a car battery could be adapted to a downhole battery pack to resist rotational forces of the magnitude to which the batteries would be subjected to downhole.

To the inventors' knowledge, no rotational dampers or torque limiters have been applied to downhole battery packs, and in particular to battery packs used in MWD applications.

Problematically, if a battery pack is not directly rotationally coupled/affixed to the components of the drill string, twisting and disconnection of the voltage leads of the battery pack which are electrically coupled to the electronic sensors and mud pulsers can result if extensive relative rotation between these components is permitted.

The inventors have accordingly caused to be invented a battery pack and battery pack container for use downhole in a drilling environment, which is specially adapted and configured to reduce torsional acceleration forces which may otherwise be applied to the batteries contained therein, and, in embodiments where extensive relative rotation is desired to reduce torsional forces, means is provided to allow significant relative rotational movement between electrical leads from the battery, and electrical leads emanating from downhole MWD equipment which are electrically coupled to and powered by such battery pack.

Specifically, in a further refinement the invention such invention further provides an electrical coupling which allows for free relative rotation between the MWD apparatus and the battery pack, and which further overcomes the problem that voltage leads therein may become twisted. Reduced incidents of battery pack failure downhole are further thereby reduced.

In one broad embodiment of the present invention, the present invention comprises a battery pack container for use in a downhole MWD apparatus which battery pack container is configured to reduce torsional or twisting forces being imparted on one or batteries contained thereon, comprising:

(i) an elongate hollow container having an outer wall and a first and a second mutually opposite end, adapted to contain therewithin at least one battery; and (ii) torsion damping means, situated at said first end of said elongate hollow container, configured to damp angular rotation of said first end of said hollow container relative to a remaining portion of said elongate hollow container.

In a first refinement thereof the torsion damping means comprises a suitable elastomeric material, of high temperature resistance to withstand downhole temperatures typically experienced in MWD applications. Such torsional damping material is situated proximate said first end of said elongate hollow container and is interposed at a series of locations between portions of said outer wall and portions of said remaining portion of said elongate hollow container. In a preferred embodiment the elastomeric material is interposed at a series of interdigitating locations between portions of said outer wall and portions of said remaining portion of said elongate hollow container.

One suitable elastomeric material for use in this application and which is contemplated by the inventors is Viton®[1], capable of withstanding temperatures up to 230C/440F, and other co-polymers of hexafluroproplylene and vindlideneflouride.

[1] Trademark of E.I DuPont DeNemours & Company for synthetic rubber compositions Other elastomeric materials having similar capabilities with respect to thermal degradation resistance and similar modulus' of elasticities are likewise imminently suitable and will now occur to persons of skill in the art relating to MWD downhole rubber compounds.

In an additional embodiment, the elastomeric material is situated in the hollow battery pack container so as to further provide not only torsional damping but also axial damping of axial forces exerted on said battery pack.

In such additional embodiment the elastomeric material may be the same as the elastomeric material provided for the torsional damping. To provide axial damping such elastomeric material may be situated in the same, or in a different location, as the elastomeric material providing torsional damping.

In a second related embodiment of the present invention, the present invention comprises a battery pack container for use in a downhole MWD apparatus, which battery pack container is configured to prevent torsional or twisting forces being imparted on one or more batteries contained therein, comprising:

(i) an elongate hollow battery container having an outer wall, a first end, and a mutually opposite second end, adapted to contain between said first end and said second end at least one battery and provide electrical power from said at least one battery to at least said first end of said elongate battery container; and (ii) a torsion-limiting means, comprising:

(A) an electrical connector affixed to said first end of said elongate hollow container, said electrical connector having:

(a) a first end, having electrical leads extending therefrom which are electrically couplable to said at least one battery; and (b) a second end, mutually opposite to said first end of said electrical connector and in electrical communication with said first end, having electrical leads extending therefrom coupleable to electrically power-consumptive MWD apparatus, wherein said second end of said electrical connector is adapted for rotational movement relative to said first end of said electrical connector; and wherein said rotatable electrical connector is configured to permit relative rotational movement between said electrical leads from said first end of said electrical connector and said electrical leads extending outwardly from said second end of said electrical connector and not transmit torsional forces from said MWD apparatus and said second end of said electrical connector to said first end of said electrical connector and said at least one battery.

In a preferred embodiment thereof the electrical connector is an electrical slip ring connector, possessing a plurality of electrically conductive brushes contacting a corresponding plurality of electrically conductive annular rings.

One such electrical connector suitable for use with the battery pack to provide torsional limitation means is an electrical slip ring connector manufactured by Green Tweed Inc. (www.gtweed.com), model no GTC 3290.

The battery pack preferably comprises one or more batteries contained in said elongated hollow container. If more than one battery is contained therein, such more than one battery is electrically coupled to each of the remaining batteries either in a parallel circuit, or in a series configuration, to thereby provide the required electrical voltage and amp hour power longevity for the required application.

Such second embodiment of the battery pack container of the present invention may likewise further comprise an elastomeric material situated in said elongate hollow container to further provide axial damping of axial forces on said battery pack.

Specifically, an elastomeric material may further be situated within the elongate hollow container and interposed between portions of said outer wall of said battery to provide axial damping.

Finally, in a further related embodiment of the present invention, the invention comprises a MWD power supply system for use in a downhole MWD apparatus, configured to prevent torsional or twisting forces from the MWD apparatus being imparted on one or more batteries therein, comprising:
  (i) an elongate hollow battery container having a first end, and a mutually opposite second end, adapted to between said first end and said second end contain at least one battery and provide electrical power from said at least one battery to at least said first end of said elongate battery container;
  (ii) at least one battery, contained in said battery container;
  (iii) torsion limiting means, comprising:
    (A) a female or male electrical connector half, affixed to said first end of said battery container, having electrical leads extending therefrom which are electrically coupled to said at least one battery; and
    (B) a mating male or female electrical connector half, opposite in gender to that in sub-paragraph (A) above, fixedly coupled to said MWD apparatus and having electrical leads extending therefrom coupleable to electrically power-consumptive MWD apparatus;
    wherein said female or male electrical connector half in subparagraph (A) above is freely rotatable within said male or female electrical connecter half of subparagraph (B) above while simultaneously providing electrical communication therebetween and permitting relative rotational movement between said electrical leads from said electrical connector half of subparagraph (A) and said electrical leads extending from said second electrical connector half of subparagraph (B) and does not transmit torsional forces from said MWD apparatus to said at least one battery in said battery pack.

In one embodiment of the MWD power supply system, one of said electrical connectors of paragraph (A) or (B) possesses a plurality of electrically conductive brushes and the remaining mating electrical connector of subparagraph (A) or (B) comprises a corresponding plurality of electrically conductive annular rings, which when one electrical connector is inserted in the other said electrically conductive brushes respectively contact said annular rings.

Again, the MWD power supply system as disclosed above may further comprise an elastomeric material situated proximate said first end of said elongate hollow container to further and additionally provide axial damping of axial forces which are exerted on said battery pack.

Specifically, in a further embodiment wherein the torsion limiting means comprises a rotatable electrical conductor, an elastomeric material may further be situated proximate said first end of said elongate hollow container and interposed between portions of an outer wall of said battery container wall and a remaining portion of said battery container, to further provide axial damping of axial forces on said battery pack.

BRIEF DESCRIPTION OF THE DRAWINGS

Further advantages and permutations and combinations of the invention will now appear from the above and from the following detailed description of the various particular embodiments of the invention, taken together with the accompanying drawings each of which are intended to be non-limiting, in which:

FIG. 1A is an enlarged view of region "A" of FIG. 1;

FIG. 3A is an enlarged view of region "A" as shown in each of FIG. 3 and FIG. 6;

FIG. 3B is an enlarged view of region "B" of FIG. 3;

FIG. 7 is a side perspective view of another battery pack system of the present invention, having torsion-limiting means in the form electrical connectors at each of opposite ends of the battery pack;

FIG. 8 is an enlarged, exploded, semi-transparent view of the battery pack shown in FIG. 7;

FIG. 13 is a partially exploded view showing the manner of locating and inserting the battery pack of FIG. 10 within a sealed assembly for insertion downhole;

FIG. 14 is a cross sectional view of the battery pack system of FIG. 10, showing the manner of electrically coupling the battery pack system to uphole and downhole electrical MWD components while providing torsional isolation for the batteries within the battery pack system;

FIG. 15 is a further modification of the battery pack system shown in FIG. 10, further having additional (alternative) torsion reduction means on an electrical connector mounted to an MWD device, which connects electrically to the battery pack';

FIG. 16 is a side perspective view of the elements shown in FIG. 15, showing the manner of inter-connecting the electrical connector of the MWD apparatus with the one end of the battery pack;

FIG. 18 side perspective view of an embodiment of the battery pack/battery pack system of the present invention having an elastomeric material situated proximate mutually opposite ends of the hollow battery container, interposed in an interdigitating manner between portions of the outer wall of said battery container and remaining portions of the battery container to thereby provide not only torsional damping of rotational forces but also axial damping of axial forces which would otherwise be directly transmitted to batteries within the battery container.

DETAILED DESCRIPTION OF SOME PREFERRED EMBODIMENTS

Figure 1:
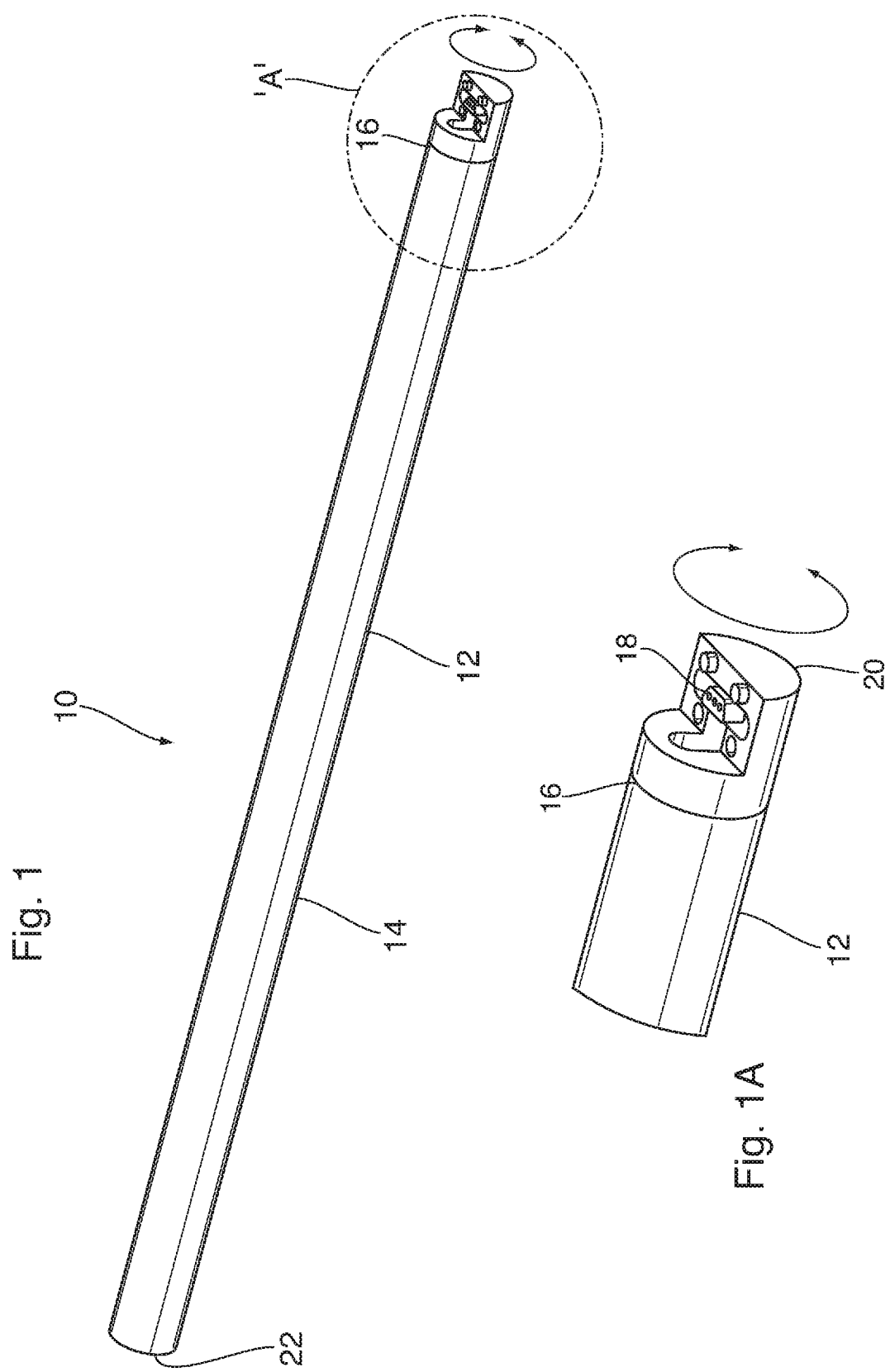
FIG. 1 is a perspective view of one embodiment of the battery pack/battery pack system of the present invention.

FIG. 1 shows a first embodiment of the battery pack/battery pack system 10 of the present invention for use in a downhole MWD apparatus, with FIG. 1A showing an enlarged view of a first end 20 in region "A" thereof.

Figure 2:
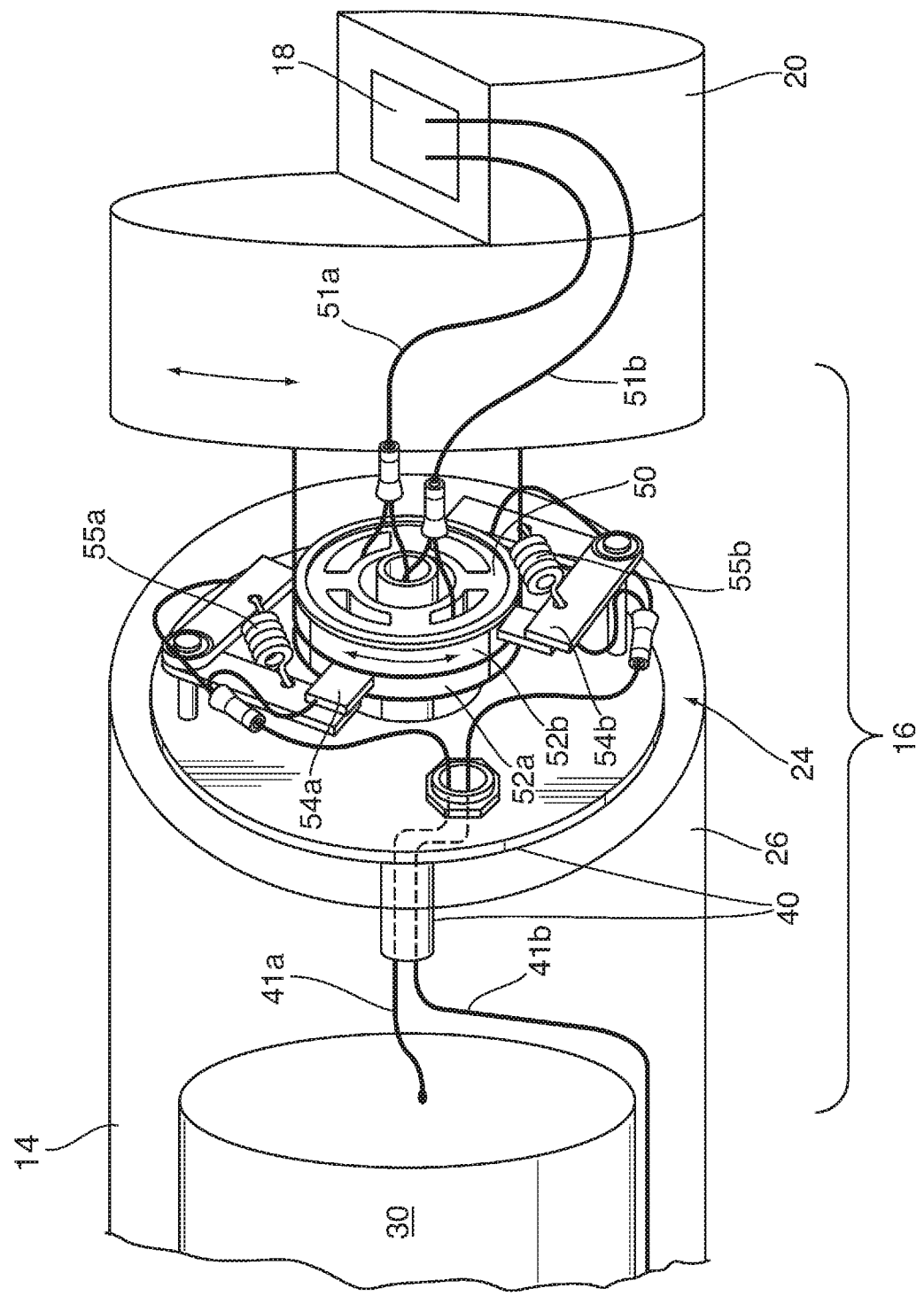
FIG. 2 is an enlarged semi-transparent view of region "A" of FIG. 1.

An elongate hollow container 12 is provided, having an outer wall 14, a first end 20 and a mutually opposite second end 22, adapted to contain therewithin at least one battery (item 30, FIG. 2, 4).

An electrical socket 18 is preferably provided at first end 20 for allowing electrical coupling of battery pack 10 to electrically power-consumptive MWD sensors and mud pulsers (not shown).

Torsion damping means 16 are situated at said first end 20 of elongate hollow container 12. Torsion damping means 16 damps angular rotation of first end 20 of hollow battery container 12 relative to a remaining portion thereof including said second end 22 of elongate battery container 12.

As may be seen in the form of the invention depicted in FIG. 2 [FIG. 2 being an enlarged semi-transparent view of region "A" of FIG. 1], torsion damping means 16 in a first embodiment thereof comprises an electrical connector 24 affixed to a portion 26 of the hollow container 12 proximate the first end 20 of the elongate hollow container 12. The electrical connector 24 in such embodiment comprises a first end 40 having electrical leads 41a, 41b extending therefrom which are electrically couplable to the at least one battery 30. At second end 50 of electrical connector 24 (mutually opposite first end 40 and in electrical communication with said first end 40) are provided another pair of electrical leads 51a, 51b which extend from second end 50 to electrical socket 18, where they may be electrically coupled to provide electrical current to power MWD apparatus (not shown) downhole.

Importantly, in this embodiment of the torsion limiting means 16 permits relative angular rotational movement of second end 50 of electrical connector 24 relative to the first end 40 of electrical connector 24. Specifically, electrical connector 24 is configured to permit relative rotational movement between electrical leads 41a, 41b from first end 40 and electrical leads 51a, 51b extending outwardly from second end 50 of electrical connector 24. In such manner, MWD apparatus such as sensors and mud pulsers physically and electrically connected to first end 40 of battery pack container/system 10 are torsionally isolated from acceleration and deceleration forces which may be imposed thereon via the MWD components which are physically affixed, either directly or indirectly, to the drill string.

To maintain electrical communication while allowing relative angular rotation between MWD components situated proximate the first end of the battery pack 10 and the battery pack itself, electrical connector 24 comprises, in the embodiment thereof shown in FIG. 2, electrical leads 51a, 51b in electrical communication with respectively two annular slip rings 52a, 52b, situated on second end 50 of electrical connector 24, each of which are respectively in contact with and thus in electrical communication with electrically-conductive brushes 54a, 54b. Electrically-conductive brushes 54a, 54b are in turn in electrical communication with electrical leads 51a, 51b extending from first end 40 of electrical connector 24.

Electrically conductive brushes 54a, 54b connected to leads 51a, 51b are preferably spring-biased into contact with corresponding annular ring members 52a 52b via respective springs 55a, 55b to ensure continuous contact and thus continuous electrical communication between annular ring members 52a, 52b, and conductive brushes 54a, 54b, while nevertheless permitting relative rotation therebetween and eliminating otherwise certain twisting and thus forcible parting of one or more electrical leads 51a, 51b and conductive brushes 54a, 54b and the resultant loss of supply of electrical power from battery pack 10.

The novel battery pack 10 described above thus prevents downhole MWD mud pulser sensor equipment and mud pulsers which are directly or indirectly coupled to a drill string (not shown) and which would otherwise transmit rotational forces from such drill string to first end 20 of battery container 10 coupled thereto, from being unable to do so due to the provision and configuration of electrical connector 24 provided on battery pack 10, which prevents transmittal of any rotational accelerational or decelerational forces applied to a first end 20 of battery container 12 to one or more batteries 30 contained in battery container 12.

Figure 3:
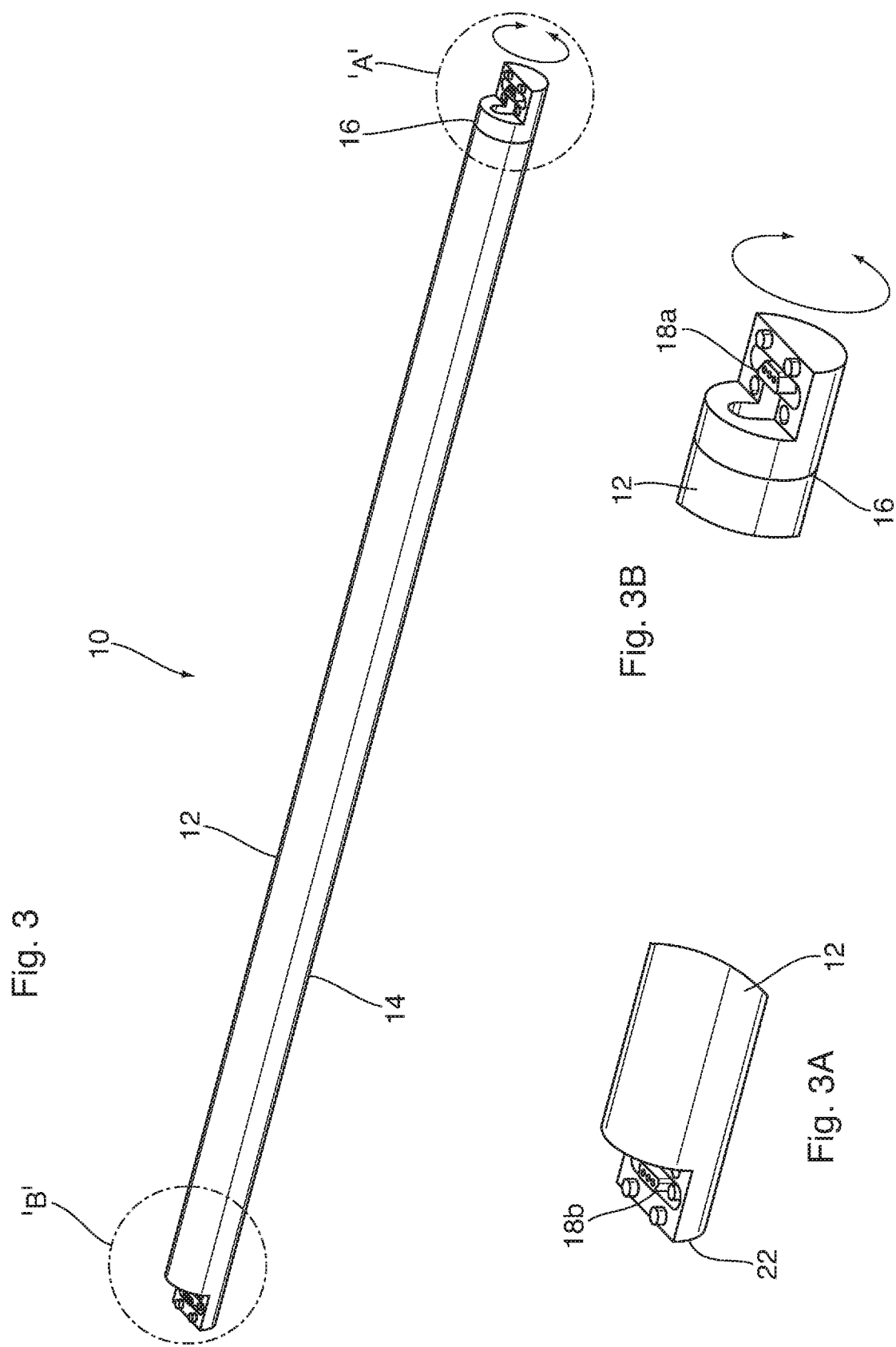
FIG. 3 is a perspective view of another embodiment of the battery pack/battery pack system of the present invention, having electrical sockets at both ends thereof providing the ability to be electrically coupled in series or in parallel with another similar battery pack.

FIG. 3 shows a preferred modification of the battery pack/battery pack system 10 of the present invention, whereby advantageously a pair of electrical sockets 18a, 18b, are provided at first end 20 and second end 22 respectively of battery pack 10, which are in electrical communication with one or more batteries 30 contained in battery pack system 10. The resultant advantage of such preferred modification being further described in more detail below and in reference to FIG. 5.

Figure 4:
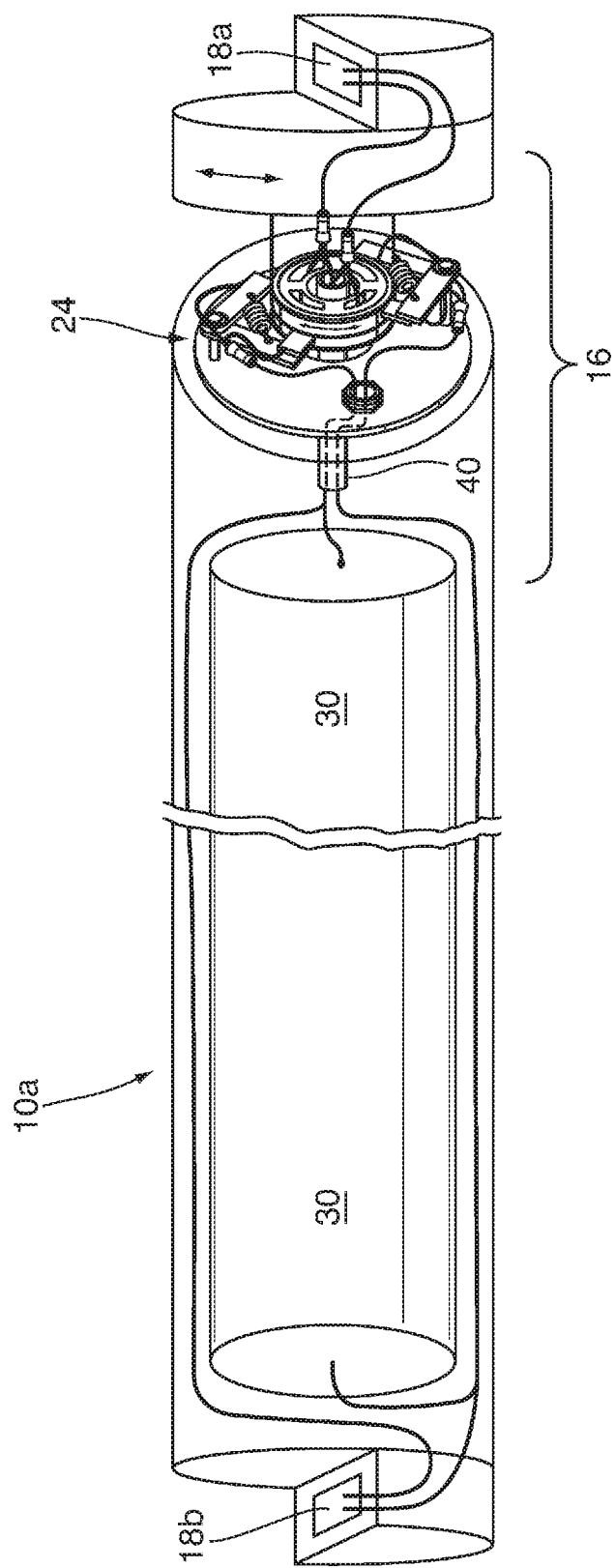
FIG. 4 is a semi-transparent view of the battery pack of FIG. 3.

FIG. 4 is a semi-transparent view of the battery pack of FIG. 3.

Figure 5:
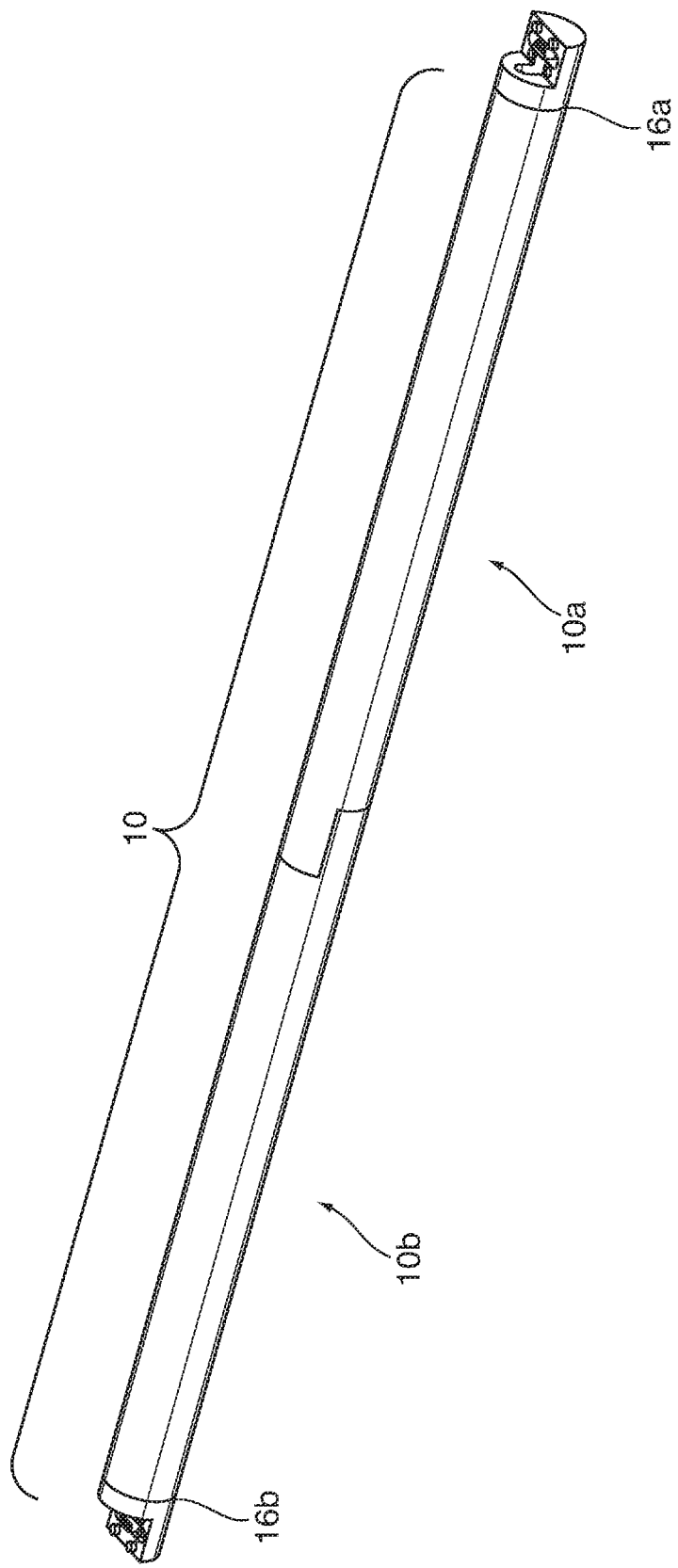
FIG. 5 is a side perspective view of the embodiment of the battery pack/battery pack system shown in FIG. 3, wherein two such battery packs are electrically coupled together, in either a "series" or "parallel" electrical coupling.

Advantageously, and as seen from FIG. 5, batteries packs of this configuration, such as battery packs 10a and 10b, may be "daisy chained" (i.e. coupled in end-to end manner) as shown in FIG. 5 where respective second ends 22 thereof are electrically and physically coupled together to thereby provide torsional isolation at both ends of the battery pack with respect to any MWD equipment which may be physically and/or electrically coupled to such ends thereof.

Figure 6:
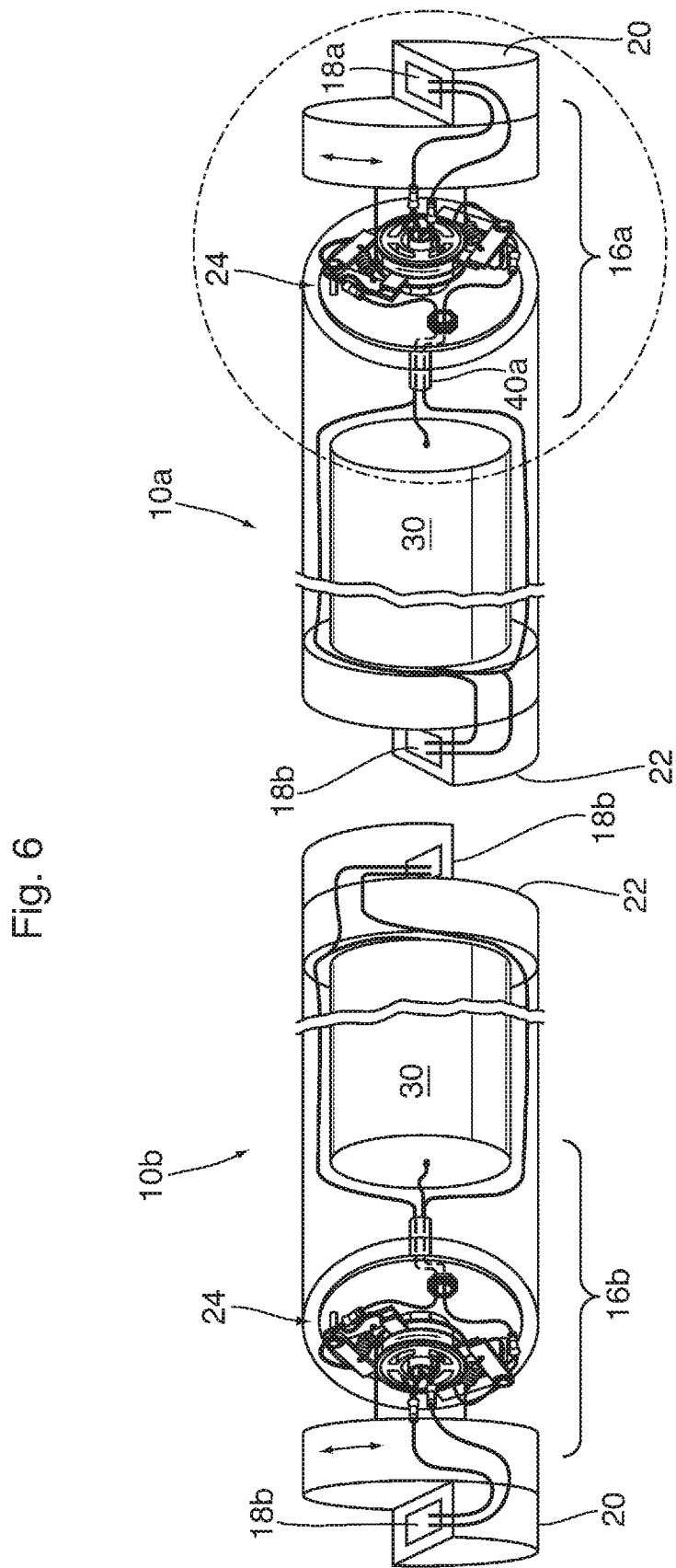
FIG. 6 is an enlarged, exploded, semi-transparent view of the electrically coupled battery packs of FIG. 5.

FIG. 6 depicts a semi-transparent partially exploded view of the resulting coupled battery pack of FIG. 5, comprising coupled battery packs 10a and 10b physically and electrically coupled together at their respective second ends 22.

FIG. 7 shows another embodiment of the battery pack of the present invention, namely a single battery pack 10c having electrical socket connectors 18a, 18b at respective first and second ends 20, 22 thereof for electrically and physically coupling to MWD electrical equipment and mud pulsers. Such battery pack 10c further has torsion limiting means 16a, 16b as described below at opposite ends 20, 22 thereof.

FIG. 8 shows an enlarged, exploded, semi-transparent view of the battery pack 10c shown in FIG. 7.

Advantageously, however, as may be seen from FIGS. 7 & 8, torsional limiting means 16a, 16b in the form of electrical connectors 24a, 24b connected to battery pack ends 40a, 40b, as described above, are provided in battery container 12 proximate each of respective first and second mutually opposite ends 20, 22, to prevent torsional forces from being transmitted from either or both ends 20, 22 to batteries 30 situated therein.

Figure 9:
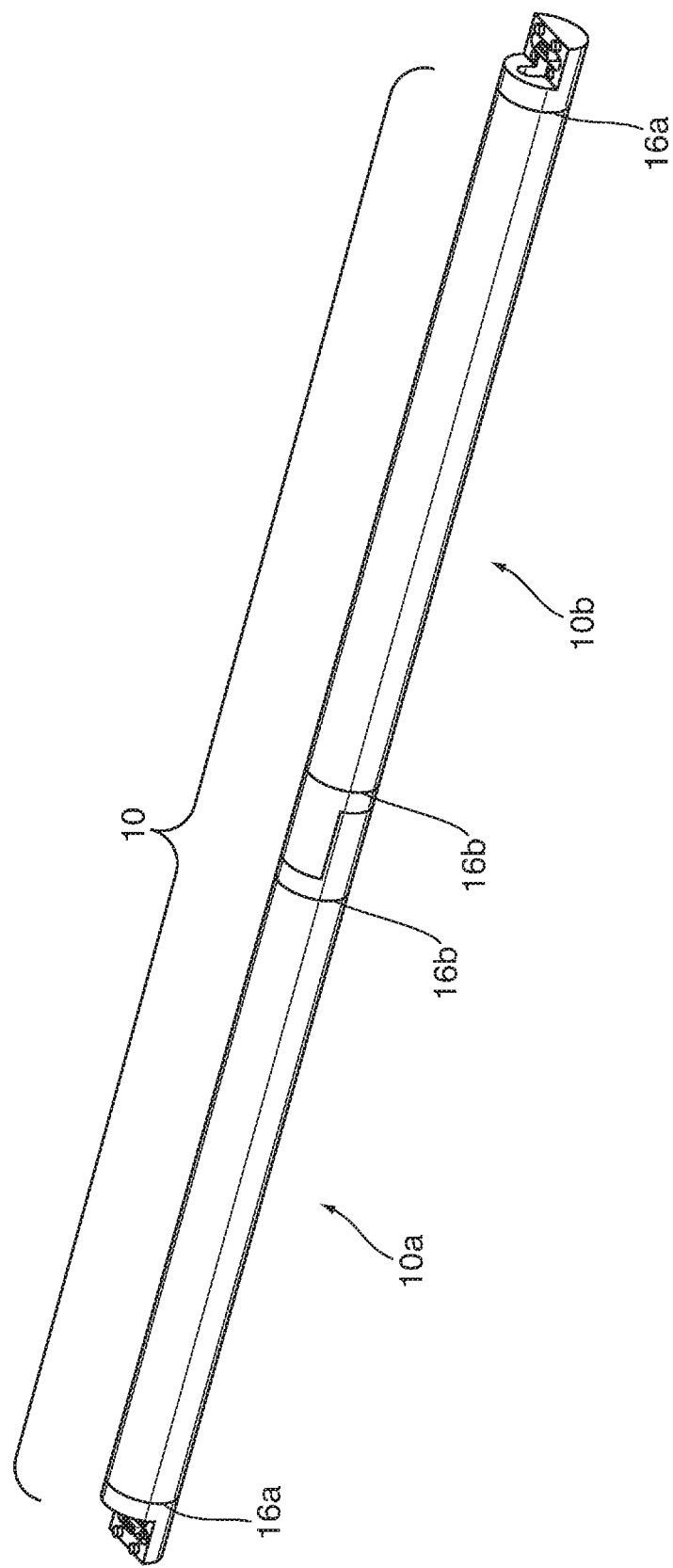
FIG. 9 is a side perspective view of two battery packs as shown in FIG. 7 coupled in "daisy chained" (i.e.end-to-end) configuration.

Further advantageously, the configuration of the battery pack system of FIGS. 7 and 8 likewise allow for battery packs 10a, 10b of such design to be "daisy chained" together in end-to-end relation in either "parallel" or "series" electrical coupling to form a single battery pack 10, as shown in FIG. 9, allowing more flexibility in providing battery power from combined battery pack 10 most suited to the electrical demands and desired longevity for powering downhole electrical equipment which is directly or indirectly also or physically coupled thereto.

Importantly, the invention is not to be understood as being limited to the type of electrical slip ring connectors 24 as described above for providing torsion limiting means, and many alternative configurations for electrical connectors which allow relative rotational movement between electrical leads coupled to a downhole MWD apparatus, and electrical leads 41a, 41b coupled to one or more batteries 30, are contemplated.

One alternative electrical conductor configuration for the battery pack system of the present invention which is equally workable as the slip ring connector 24 is male-female electrical connector half members 71, 72, comprising a male cylindrical half member 71 with a plurality of electrically conductive annular rings 75 thereon which is situated at a first end 20 of battery container 12 and electrically coupled to batteries 30 contained therein, as shown for example in FIGS. 10-14 herein.

For example, a male electrical connector half member 71 forming part of battery pack system 10d, may be releasibly lockingly inserted with a mating female connector half member 72 having a corresponding plurality of resiliently flexible electrically conductive elements 76 peripherally surrounding an inner cylindrical surface 80 thereof adapted to contact the annular rings 75 in any and all angular rotations of the male electrical connector 71 when inserted in female connector 72.

Many other equally suitable forms of electrical connectors which allow relative rotation therebetween but continuously allow electrical connection will now occur to persons of skill in the art. All are equally contemplated as being utilizable for providing the torsion limiting capability of the present invention.

Torsional limiting means 16a, 16b of the present invention, such as employed in the battery pack system 10 shown in FIG. 9, advantageously allows electrical MWD equipment (not shown) to be electrically and physically coupled to both first and second ends 20, 22 of battery pack 10c each to be torsionally isolated from batteries 30 within battery container 12. Thus all batteries 30 contained therein are torsionally isolated from rotational accelerative and decelerative forces being applied to battery (ies) 30 from either or both ends 20, 22 of battery container 12.

In this regard, FIGS. 10-14 show a battery pack system/ assembly 10d of the present invention, wherein the torsion-limiting means 16 comprises respective mating male 71 and female 72 rotatable electrical connectors, one of which is situated on at least one end 20 of battery pack system 10d, and the other of which is electrically and physically coupled, directly or indirectly, to MWD electrical apparatus (not shown) for which battery power is required to operate.

Figure 10:
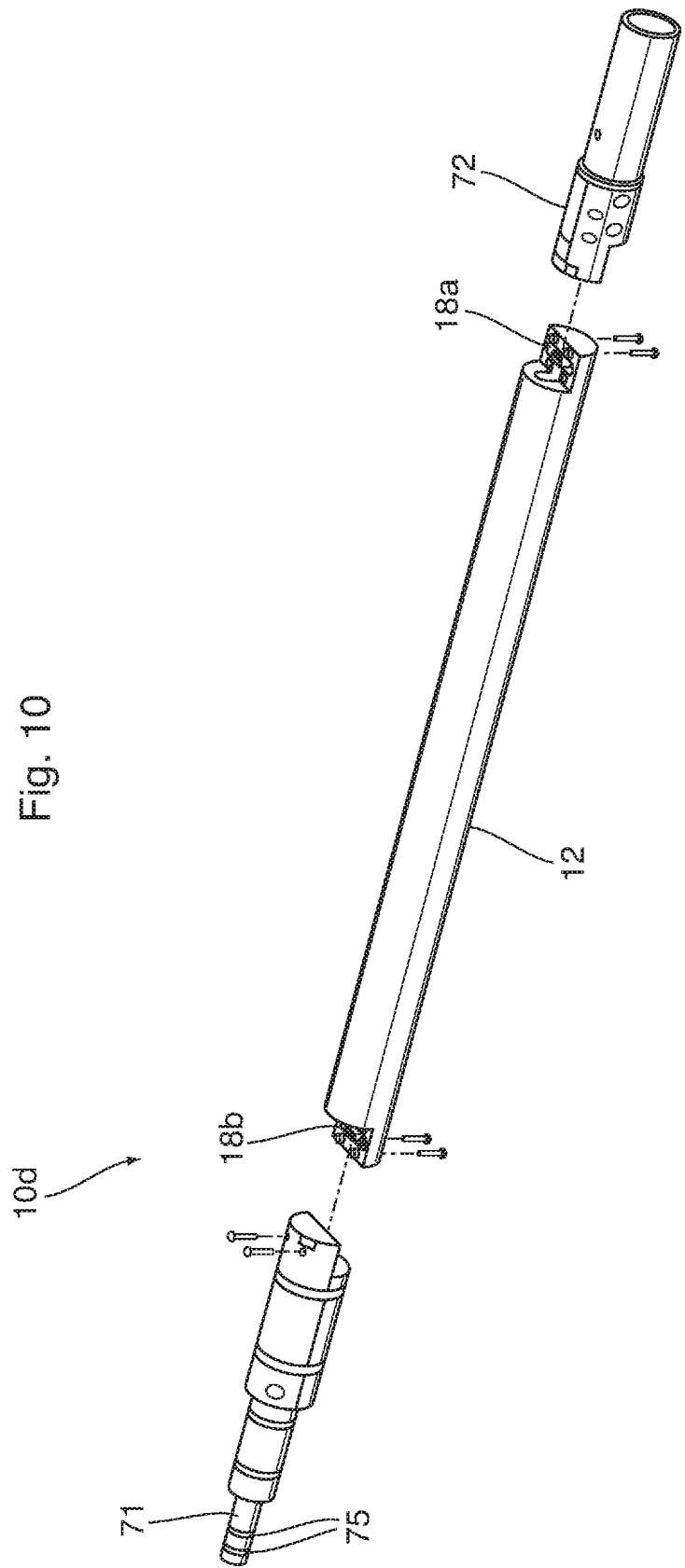
FIG. 10 is an exploded view showing an alternative battery pack system of the present invention, utilizing a battery pack torsion-limiting means wherein gender-opposite male and female rotatable connectors are electrically coupled to mutually opposite ends of the battery pack.
Figure 11:
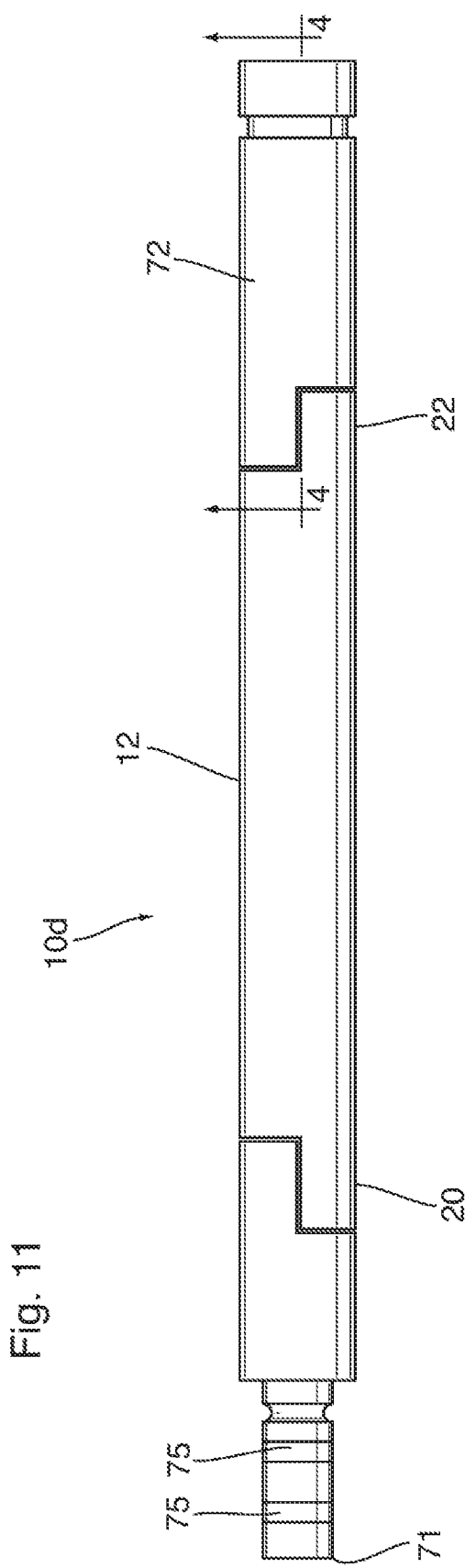
FIG. 11 is a side view of the battery pack assembly of FIG. 10, in assembled condition.

With reference to FIGS. 10 and 11, FIG. 10 shows such an alternative battery pack system 10d as immediately described, utilizing a battery pack having torsion-limiting means 16 wherein gender-opposite male and female rotatable electrical connectors half members 71, 72 are disposed at mutually opposite ends of battery pack 10d and which are respectively electrically coupled to mutually opposite ends 20, 22 of the battery pack 10d.

FIG. 11 is a side view of the battery pack assembly 10d of FIG. 10, in assembled condition.

Figure 12:
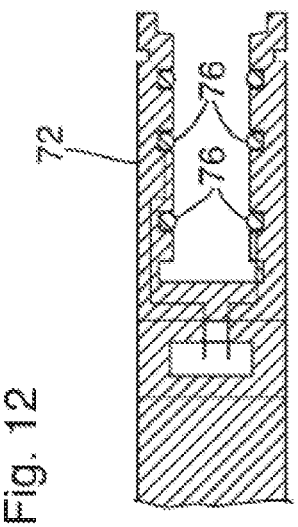
FIG. 12 is a cross-sectional view taken along plane 4-4 of FIG. 11.

FIG. 12 is a cross-sectional view taken along plane 4-4 of FIG. 11, showing the configuration of the female electrical connector half member 72 coupled to end 22 of battery container 12;

FIG. 13 is a partially exploded view showing the manner of locating and inserting the battery pack 10d of FIG. 10 within a sealed assembly 90 for insertion within drill pipe (not shown).

FIG. 14 is a cross sectional view of the battery pack system 10d of FIG. 10, showing the manner of electrically coupling the battery pack system 10d to uphole and downhole electrical MWD components while providing torsional isolation for the batteries 30 within the battery pack system 10d;

Other torsional limiting means 16a, 16b other than electrical connectors 24 or male-female electrical connectors 71, 72 of the type described above may be employed to allow for relative angular rotation.

Specifically, the torsion limiting means 16 of the present invention is not to be understood as being limited to electrical slip ring connectors 24 or mating rotatable electrical connector male-female half-members 71,72 as described above for providing torsion limiting means, and many alternative torsional limiting means are contemplated.

For example, in substitution of any of the electrical connectors 24, 24a, or 24b or mating rotatable electrical connector male-female half-members 71,72 contemplated for use in the present invention as torsion limiting means 16, instead (or in addition) an elastomeric material 60 may be interposed in hollow battery container 12 in the outer wall 14 thereof, as shown for example in FIGS. 17 & 18 further described below, to resiliently absorb and frictionally damp high acceleration and deceleration forces exerted on battery pack 10, 10b, or 10c. The amount of allowed relative angular rotation, where the elastomeric material is comprised of a material such as Viton®, while not as large as in the case of electrical slip ring connectors 24, is sufficient to damp to a degree torsional forces and allow a degree of relative angular rotation to absorb sudden transitional accelerative forces, but nevertheless not being so significant to thereby overtwist electrical leads 41a, 41b, and 51a, 51b which are physically coupled together and in electrical communication.

Figure 17:
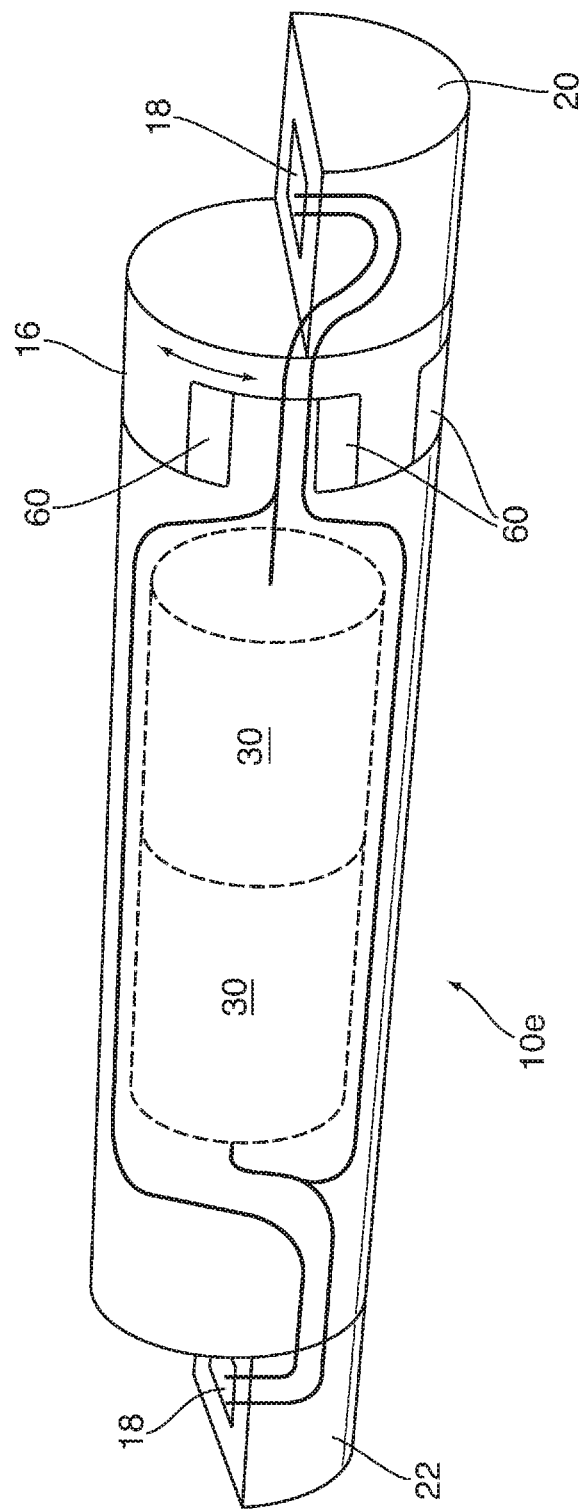
FIG. 17 is a side perspective view semi-transparent view of a further embodiment of the battery pack/battery pack system of the present invention having an elastomeric material situated proximate the first end of the elongate hollow battery container and interposed in an interdigitating manner between portions of the outer wall of said battery container and remaining portions of the battery container to provide not only torsional damping of rotational forces but also axial damping of axial forces.

By way of example, FIGS. 17-18 show a battery pack system/assembly 10e, where the torsion-limiting means 16 comprises an elastomeric material 60 situated proximate said first end 20 of said elongate hollow container 12 and interposed in an interdigitating manner between portions of said outer wall 14 and a remaining portions of battery container 12 which provides torsional damping of rotational forces applied to said first end 20 of battery container 12 (which is physically and electrically coupled, directly or indirectly to MWD equipment which is in turn physically coupled to an MWD sub located in the drill string) relative to a remaining portion and said second end 22 of battery container 12 to thereby torsionally isolate batteries 30 in such battery container 12.

FIG. 17 shows a side perspective view of a further embodiment of the battery pack/battery pack system of the present invention 10e having an elastomeric material situated proximate the first end 20 of the elongate hollow battery container 12 and interposed in an interdigitating manner between portions of the outer wall 14 of battery container 12 and remaining portions of the battery container 12 to thereby provide not only torsional damping of rotational forces but also axial damping of axial forces; and FIG. 18 is side perspective view of the battery pack/battery pack system 10e of the present invention depicted in FIG. 17, having torsional limiting means 16 in the form of an interposed elastomeric material 60 disposed proximate each of opposite ends 20, 22 of battery container 12, to thereby isolate batteries 30 therein from torsional accelerative and decelearative forces which may be applied to either or both ends 20, 22 of battery container 12.

FIG. 15 is a further modification of the battery pack system 10d shown in FIG. 10, further having additional further torsion reduction means 16 in addition to the rotatable male and female electrical connectors 71, 72, further having additional torsional damping feature 16 in the form of an elastomeric material 60 mounted in a cavity 92 on female connector half 72, in which protruding prongs 94 of the battery container 12 proximate male half member 71 may be inserted into apertures 97 centrally located in elastomeric material 60 on female connector half member 72. In such manner relative angular rotation in either direction between half members 71, 72 is damped.

FIG. 16 is a side perspective view of the elements shown in FIG. 15, and shows the manner of inter-connecting the electrical connector 100 of the MWD apparatus with a first end 20 of the battery pack 10 having a male rotatable electrical connector half member 71 thereon. FIG. 16 shows how the protruding prongs 94 on the first end 20 of the battery container 12 are inserted into apertures 97 within elastomeric material 60 situated on female rotatable connector half member 72, to thereby provide relative angular damped rotation between half member 72 and battery container 12.

Many other torsional damping configurations using elastomeric materials 60 or resiliently-biased members such as and including but not limited to torsional springs interposed in the battery container 12 of the battery pack system 10, may be used and will now occur to persons of skill in the art.

Such alternative torsion-limiting means 16 may be used in association with battery container 12 and forming part of the battery pack system 10 of the present invention. All are equally contemplated as being within the scope of the invention herein.

For a complete definition of the invention and its intended scope, reference is to be made to the summary of the invention and the appended claims read together with and considered with the disclosure and drawings herein.

We claim:

1. A battery pack container for use in a downhole MWD apparatus which battery pack container is configured to reduce torsional or twisting forces which may be imparted on one or more batteries contained therein, comprising:
   (i) an elongate hollow container having an outer wall and a first and a second mutually opposite end, adapted to contain therewithin at least one battery; and
   (ii) torsion damping means, situated at said first end of said elongate hollow container, configured to damp angular rotation of said first end of said hollow container relative to a remaining portion of said elongate hollow container.

2. The battery pack container as claimed in claim 1, wherein said torsion damping means comprises an elastomeric material situated proximate said first end of said elongate hollow container and interposed between portions of said outer wall and said remaining portion of said elongate hollow container which provides torsional damping of rotational forces applied to said first end relative to said remaining portion and said second end of said hollow container.

3. The battery pack as claimed in claim 2, wherein said elastomeric material is situated in said hollow container so as to further provide axial damping of axial forces exerted on said first end of said battery pack relative to said second end thereof.

4. A battery pack container for use in a downhole MWD apparatus, which battery pack container is configured to prevent torsional or twisting forces being imparted on one or more batteries contained therein, comprising:
   (i) an elongate battery container having an outer wall surrounding a hollow containment volume, a first end, and a mutually opposite second end, adapted to contain between said first end and said second end and within said hollow containment volume at least one battery and provide electrical power from said at least one battery to at least said first end of said elongate battery container; and
   (ii) torsion limiting means, comprising:
      (A) an electrical connector affixed to a portion of said hollow container proximate said first end of said elongate hollow container, said electrical connector having:
         (a) a first end, having electrical leads extending therefrom which are electrically coupleable to said at least one battery; and
         (b) a second end, mutually opposite to said first end of said electrical connector and in electrical communication with said first end, having electrical leads extending therefrom coupleable to electrically power-consumptive MWD apparatus, wherein said second end of said electrical connector is adapted for rotational movement relative to said first end of said electrical connector and to said first end of said elongate hollow container; and
   wherein said electrical connector is configured to permit relative rotational movement between said electrical leads from said first end of said electrical connector and said electrical leads extending outwardly from said second end of said electrical connector.

5. The battery pack container as claimed in claim 4, wherein:
said electrical connector is an electrical slip ring connector possessing a plurality of electrically conductive brushes contacting a corresponding plurality of electrically conductive annular rings.

6. The battery pack container as claimed in claim 4, further comprising:
one or more batteries contained in said elongated hollow container.

7. The battery pack container as claimed in claim 6, wherein said one or more batteries are of the lithium ion type.

8. The battery pack as claimed in claim 4, further comprising an elastomeric material situated proximate said first end of said elongate hollow container and interposed between portions of said outer wall of said battery container and remaining portions of said battery container, to further provide axial damping of axial forces on said battery pack.

9. A measurement-while-drilling ("MWD") power supply system for use in a downhole MWD apparatus and configured to prevent torsional or twisting forces from the MWD apparatus being imparted on one or more batteries therein, comprising:
(i) an elongate hollow battery container having a first end and a mutually opposite second end, adapted to contain at least one battery between said first end and said second end and to provide electrical power from said at least one battery to at least said first end of said elongate battery container;
(ii) at least one battery, contained in said battery container;
(iii) torsion limiting means situated proximate said first end of said battery container, comprising:
(A) a female or male electrical connector half member, affixed to said first end of said battery container, having electrical leads extending therefrom which are electrically coupled to said at least one battery; and
(B) a male or female electrical connector half member, opposite in gender to that in sub-paragraph (A) above, fixedly coupled to said MWD apparatus and having electrical leads extending therefrom coupleable to electrically power-consumptive MWD apparatus;
wherein said female or male electrical connector half member in subparagraph (A) above is freely rotatable relative to said male or female electrical connecter half member of subparagraph (B) above while simultaneously providing electrical communication therebetween and permitting relative rotational movement between said electrical leads from said electrical connector half member of subparagraph (A) and said electrical leads extending from said second electrical connector half member of subparagraph (B) and does not transmit torsional forces from said MWD apparatus to said at least one battery in said battery pack.

10. The MWD power supply system as claimed in claim 9, wherein one of said electrical connector half members of subparagraph (A) or (B) possesses a plurality of electrically conductive brushes and the remaining of said electrical connector half members of subparagraph (A) or (B) comprises a corresponding plurality of electrically conductive annular rings, which when one of said electrical connector half members is inserted in the other a pair of said electrically conductive brushes therein respectively contact a corresponding pair of said annular rings and thereby permit electrical communication between said brushes and said annular rings.

11. The MWD power supply system as claimed in claim 9, further comprising an elastomeric material situated proximate said first end of said elongate hollow container and interposed between portions of an outer wall of said battery container and remaining portions of said battery container, to further provide axial damping of axial forces which are exerted on said battery pack.

* * * * *